US012571856B2

(12) United States Patent
Kim et al.

(10) Patent No.: US 12,571,856 B2
(45) Date of Patent: Mar. 10, 2026

(54) ELECTRONIC DEVICE AND METHOD FOR INSPECTING CABLE CONNECTION CIRCUIT OF ELECTRONIC DEVICE

(71) Applicant: Samsung Electronics Co., Ltd., Suwon-si (KR)

(72) Inventors: Sunglak Kim, Suwon-si (KR); Yongyeon Kim, Suwon-si (KR); Hyeongki Nam, Suwon-si (KR); Sungho Park, Suwon-si (KR); Jaebum Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 166 days.

(21) Appl. No.: 18/633,892

(22) Filed: Apr. 12, 2024

(65) Prior Publication Data

US 2024/0255585 A1 Aug. 1, 2024

Related U.S. Application Data

(63) Continuation of application No. PCT/KR2022/015705, filed on Oct. 17, 2022.

(30) Foreign Application Priority Data

Oct. 22, 2021 (KR) ........................ 10-2021-0141622

(51) Int. Cl.
*G01R 31/55* (2020.01)
*G01R 19/165* (2006.01)
(Continued)

(52) U.S. Cl.
CPC ....... *G01R 31/55* (2020.01); *G01R 19/16533* (2013.01); *H02H 1/0092* (2013.01);
(Continued)

(58) Field of Classification Search
CPC .......................... G01R 31/55; G01R 19/16533; G01R 19/165; G01R 31/52; G01R 31/70;
(Continued)

(56) References Cited

U.S. PATENT DOCUMENTS 9,935,482 B1 * 4/2018 Leabman .............. H02J 50/402
10,265,530 B1 * 4/2019 Perryman .......... A61N 1/37217
(Continued)

FOREIGN PATENT DOCUMENTS

JP 2005-308556 A 11/2005
JP 2008-298536 A 12/2008
(Continued)

OTHER PUBLICATIONS

International Search Report dated Feb. 1, 2023, issued in International Application No. PCT/KR2022/015705.

*Primary Examiner* — Dharti H Patel
(74) *Attorney, Agent, or Firm* — Jefferson IP Law, LLP

(57) ABSTRACT

An electronic device is provided. The electronic device includes a housing, a first printed circuit board disposed inside the housing and including a first antenna, a first connector connected to the first antenna, a second antenna, and a second connector connected to the second antenna, memory storing one or more computer programs, a second printed circuit board spaced apart from the first printed circuit board inside the housing and including a power management circuit, a third connector electrically connected to the first connector, a fourth connector electrically connected to the second connector, a first detection circuit, and one or more processors communicatively coupled to the first detection circuit and the memory, a first cable electrically connecting the first connector and the third connector, and a second cable electrically connecting the second connector and the fourth connector, wherein the first detection circuit includes a first resistor disposed between the one or more
(Continued)

processors and the power management circuit, and the first printed circuit board includes a second resistor branched between the first antenna and the first connector and electrically connected to the ground, and a third resistor branched between the second antenna and the second connector and electrically connected to the ground.

20 Claims, 12 Drawing Sheets

(51) Int. Cl.
  *H02H 1/00* (2006.01)
  *H02H 3/12* (2006.01)
  *H05K 1/14* (2006.01)
(52) U.S. Cl.
  CPC ................. *H02H 3/12* (2013.01); *H05K 1/14* (2013.01); *H05K 2201/10098* (2013.01)
(58) Field of Classification Search
  CPC .. G01R 19/16566; H02H 1/0092; H02H 3/12; H05K 1/14; H05K 2201/10098
  See application file for complete search history.

(56) References Cited

U.S. PATENT DOCUMENTS

| | | | | |
|---|---|---|---|---|
| 10,430,784 | B1 * | 10/2019 | He | ............................ H01Q 1/38 |
| 10,468,784 | B1 * | 11/2019 | Herndon, Jr. | .......... G01V 3/104 |
| 11,056,827 | B2 | 7/2021 | Yeo et al. | |
| 2007/0024423 | A1 * | 2/2007 | Nikitin | ............... G06K 19/0723 |
| | | | | 340/10.5 |

| | | | | |
|---|---|---|---|---|
| 2008/0233869 | A1 * | 9/2008 | Baker | ..................... H03L 7/181 |
| | | | | 455/41.1 |
| 2008/0299819 | A1 | 12/2008 | Kakutani | |
| 2013/0187807 | A1 * | 7/2013 | Peng | ......................... H01Q 3/24 |
| | | | | 342/175 |
| 2014/0266018 | A1 * | 9/2014 | Carobolante | ........... H02J 50/60 |
| | | | | 320/108 |
| 2018/0167991 | A1 * | 6/2018 | Bathich | .................. H04W 76/15 |
| 2018/0182217 | A1 * | 6/2018 | Lamothe | ......... G06K 19/07381 |
| 2019/0027432 | A1 * | 1/2019 | Dalmia | .................... H01L 24/13 |
| 2019/0027833 | A1 * | 1/2019 | Ayala Vazquez | ...... H01Q 5/342 |
| 2019/0089100 | A1 | 3/2019 | Kim | |
| 2019/0349025 | A1 * | 11/2019 | Murakami | ............... H01Q 1/38 |
| 2020/0194928 | A1 * | 6/2020 | Yeo | ......................... H01Q 1/245 |
| 2021/0051798 | A1 * | 2/2021 | Yoo | ........................... H05K 1/16 |
| 2021/0175620 | A1 * | 6/2021 | Adamo | ................. H01Q 3/267 |
| 2022/0052723 | A1 | 2/2022 | Kim et al. | |
| 2022/0326313 | A1 * | 10/2022 | Kim | ....................... G01R 15/18 |
| 2023/0275467 | A1 * | 8/2023 | Farkas | ...................... H01P 5/00 |
| | | | | 320/108 |
| 2023/0361485 | A1 * | 11/2023 | Hassan | .................... H04B 1/40 |
| 2024/0396506 | A1 * | 11/2024 | Kim | ........................ H03F 3/245 |
| 2025/0197030 | A1 * | 6/2025 | Pereira | ................. B64G 1/1007 |

FOREIGN PATENT DOCUMENTS

| | | | |
|---|---|---|---|
| JP | 2011-064575 | A | 3/2011 |
| JP | 2014-219209 | A | 11/2014 |
| JP | 6464455 | B2 | 2/2019 |
| KR | 10-2016-0088152 | A | 7/2016 |
| KR | 10-2016-0104311 | A | 9/2016 |
| KR | 10-2013675 | B1 | 8/2019 |
| KR | 10-2020-0073478 | A | 6/2020 |
| KR | 10-2020-0082101 | A | 7/2020 |
| KR | 10-2414449 | B1 | 6/2022 |

\* cited by examiner

Figure 2:
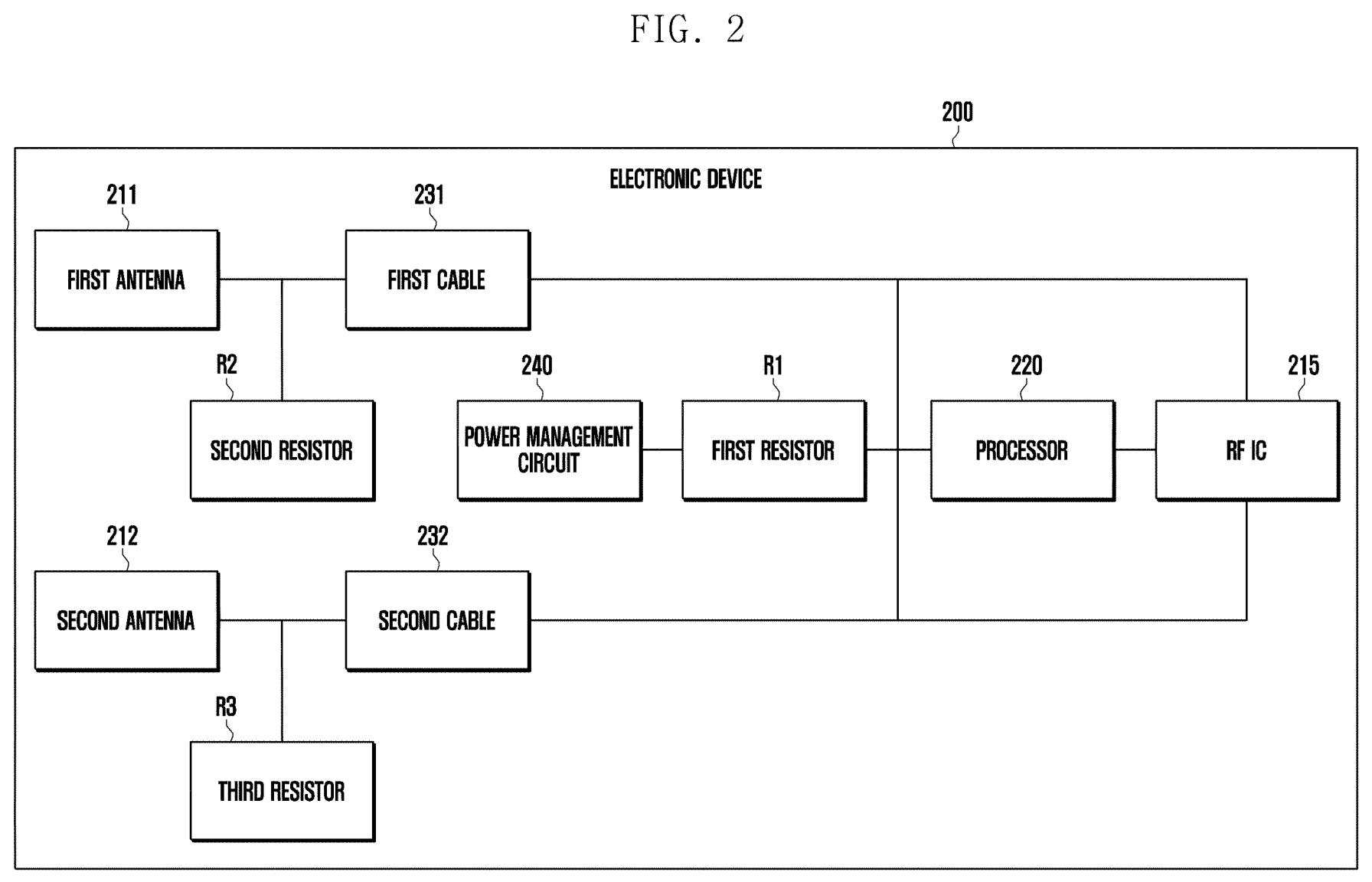

ELECTRONIC DEVICE

215 — RF IC

220 — PROCESSOR

R1 — FIRST RESISTOR

240 — POWER MANAGEMENT CIRCUIT

231 — FIRST CABLE

232 — SECOND CABLE

R2 — SECOND RESISTOR

R3 — THIRD RESISTOR

211 — FIRST ANTENNA

212 — SECOND ANTENNA

| FIRST CABLE | SECOND CABLE | MEASUREMENT VALUE |
|---|---|---|
| OK | OK | L |
| OK | NG | H |
| NG | OK | H |
| NG | NG | H |

370

| FIRST CABLE | SECOND CABLE | THIRD CABLE | MEASUREMENT VALUE |
|---|---|---|---|
| OK | OK | OK | L |
| OK | OK | NG | H |
| OK | NG | OK | H |
| OK | OK | NG | H |
| NG | OK | OK | H |
| NG | OK | NG | H |
| NG | NG | OK | H |
| NG | NG | NG | H |

START

350 — Cable Detection Check

High → 355 — IDENTIFY DEFECTIVELY ENGAGED COAXIAL CABLE AND TAKE ACTION

Low → END

TWO COAXIAL CABLES

| | FIRST CABLE | SECOND CABLE | MEASUREMENT VALUE |
|---|---|---|---|
| Case 1 | OK | OK | $V_{det} = V_{DC} \times \dfrac{\dfrac{R2 \cdot R3}{R2 + R3}}{R1 + \dfrac{R2 \cdot R3}{R2 + R3}}$ |
| Case 2 | OK | NG | $V_{det} = V_{DC} \times \dfrac{R2}{R1 + R2}$ |
| Case 3 | NG | OK | $V_{det} = V_{DC} \times \dfrac{R3}{R1 + R3}$ |
| Case 4 | NG | NG | $V_{det} = V_{DC}$ |

Figure 5A:
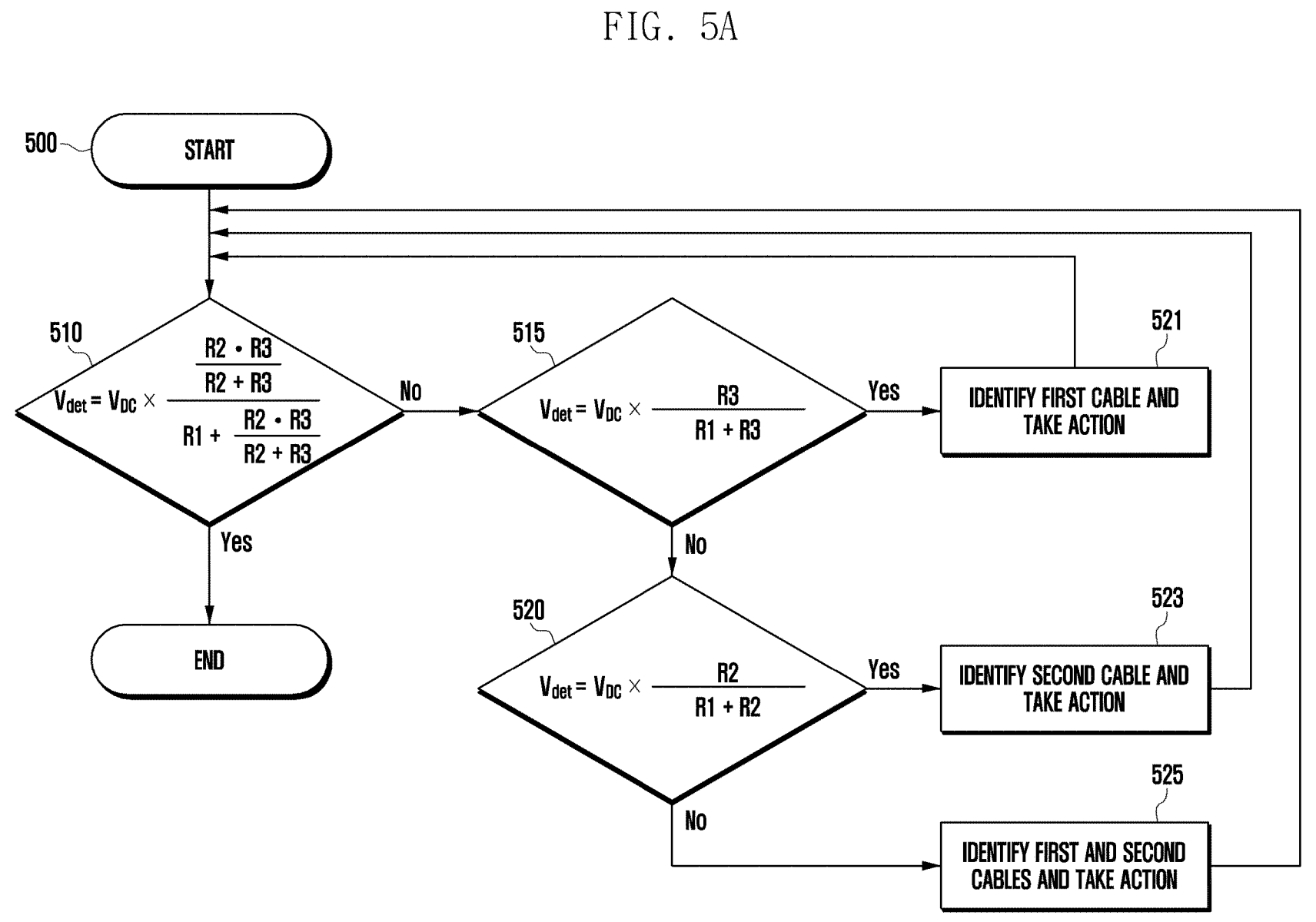

START

510

$$V_{det} = V_{DC} \times \cfrac{R1 + \cfrac{R2 \cdot R3}{R2 + R3}}{\cfrac{R2 \cdot R3}{R2 + R3}}$$

Yes → END

No

515

$$V_{det} = V_{DC} \times \frac{R3}{R1 + R3}$$

Yes → IDENTIFY FIRST CABLE AND TAKE ACTION    521

No

520

$$V_{det} = V_{DC} \times \frac{R2}{R1 + R2}$$

Yes → IDENTIFY SECOND CABLE AND TAKE ACTION    523

No → IDENTIFY FIRST AND SECOND CABLES AND TAKE ACTION    525

FIG. 5B

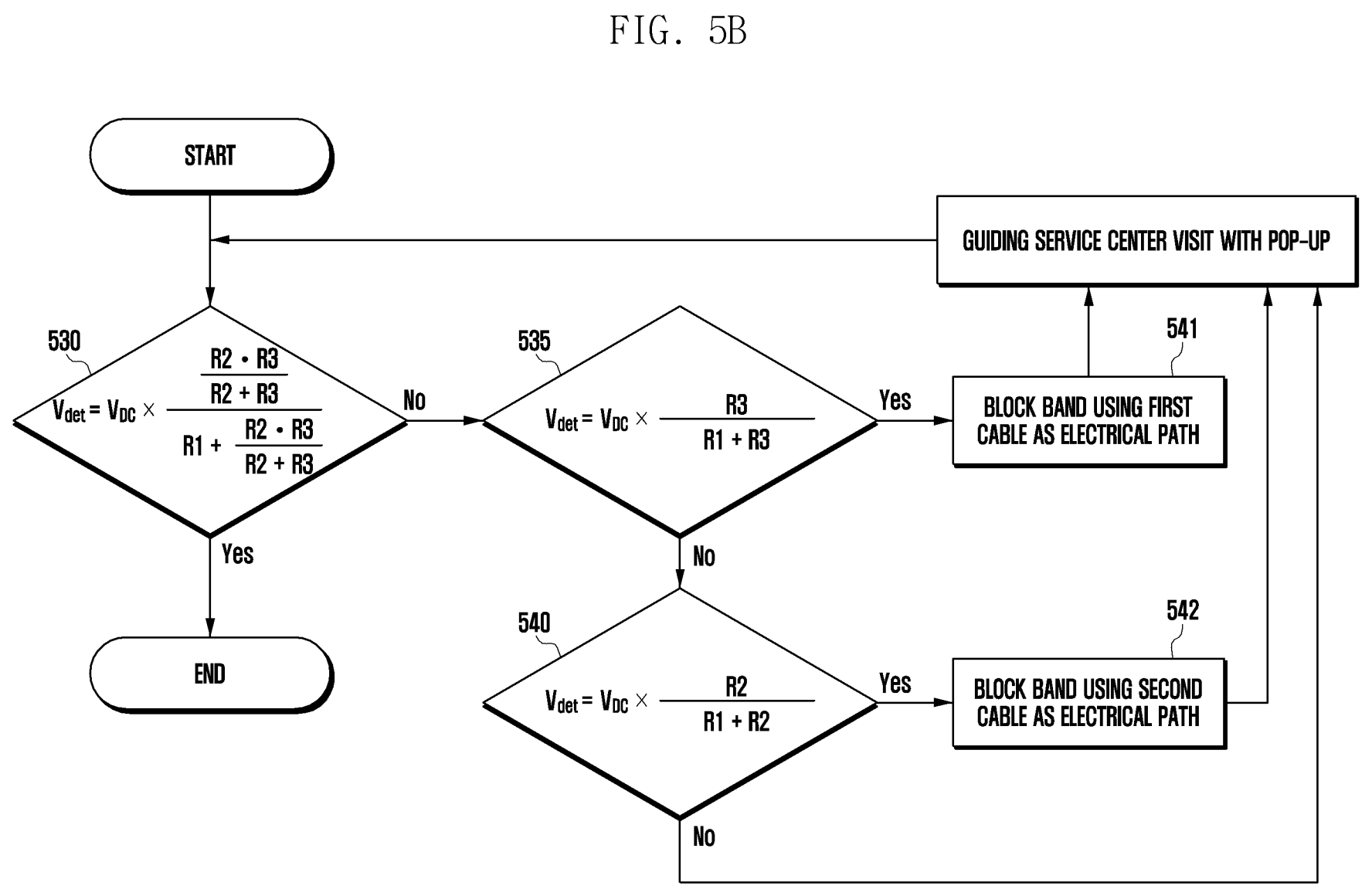

START

530   $V_{det} = V_{DC} \times \dfrac{R1 + \dfrac{R2 \cdot R3}{R2 + R3}}{\dfrac{R2 \cdot R3}{R2 + R3}}$ Yes → END No 535   $V_{det} = V_{DC} \times \dfrac{R3}{R1 + R3}$ Yes → 541   BLOCK BAND USING FIRST CABLE AS ELECTRICAL PATH No 540   $V_{det} = V_{DC} \times \dfrac{R2}{R1 + R2}$ Yes → 542   BLOCK BAND USING SECOND CABLE AS ELECTRICAL PATH No

GUIDING SERVICE CENTER VISIT WITH POP-UP

FIG. 6B

| | FIRST CABLE 631 | SECOND CABLE 632 | THIRD CABLE 633 | MEASUREMENT VALUE 635 |
|---|---|---|---|---|
| Case 1 | OK | OK | OK | $V_{det} = V_{DC} \times \dfrac{R2 \mid R3 \mid R4}{R1 + (R2 \mid R3 \mid R4)}$ |
| Case 2 | OK | OK | NG | $V_{det} = V_{DC} \times \dfrac{R2 \mid R3}{R1 + (R2 \mid R3)}$ |
| Case 3 | OK | NG | OK | $V_{det} = V_{DC} \times \dfrac{R2 \mid R4}{R1 + (R2 \mid R4)}$ |
| Case 4 | OK | NG | NG | $V_{det} = V_{DC} \times \dfrac{R2}{R1 + R2}$ |
| Case 5 | NG | OK | OK | $V_{det} = V_{DC} \times \dfrac{R3 \mid R4}{R1 + (R3 \mid R4)}$ |
| Case 6 | NG | OK | NG | $V_{det} = V_{DC} \times \dfrac{R3}{R1 + R3}$ |
| Case 7 | NG | NG | OK | $V_{det} = V_{DC} \times \dfrac{R4}{R1 + R4}$ |
| Case 8 | NG | NG | NG | $V_{det} = V_{DC}$ |

ELECTRONIC DEVICE AND METHOD FOR INSPECTING CABLE CONNECTION CIRCUIT OF ELECTRONIC DEVICE

CROSS-REFERENCE TO RELATED APPLICATION(S)

This application is a continuation application, claiming priority under § 365(c), of an International application No. PCT/KR2022/015705, filed on Oct. 17, 2022, which is based on and claims the benefit of a Korean patent application number 10-2021-0141622, filed on Oct. 22, 2021, in the Korean Intellectual Property Office, the disclosure of which is incorporated by reference herein in its entirety.

BACKGROUND

1. Field

The disclosure relates to an electronic device including a cable connection circuit and a method of detecting an engaged state of the cable connection circuit.

2. Description of Related Art

With the increasing use of portable electronic devices, such as smartphones and tablet personal computers (PCs), various functions are applied to the electronic devices.

In order to provide various functions, the electronic device may include at least one printed circuit board (PCB) and at least one connector.

The electronic device may connect the plurality of printed circuit boards, on which various electronic components are mounted, by using the connectors and transmit or receive signals or data.

The above information is presented as background information only to assist with an understanding of the disclosure. No determination has been made, and no assertion is made, as to whether any of the above might be applicable as prior art with regard to the disclosure.

SUMMARY

In case that an electronic device uses a plurality of cables to transmit radio frequency (RF) signals, only a single detection circuit is used to detect whether the plurality of cables is normally engaged. However, in case that only the single detection circuit is used, a defective engaged state is detected even when only one cable is not engaged. For this reason, it is difficult to identify which cable fails to be engaged. Actually, it is necessary to inspect the cables one by one to find the defectively engaged cable, but there is a physical limitation when the number of cables increases.

In addition, it is difficult to use the detection circuit in case that a plurality of RF lines of a main printed circuit board (PCB) is connected to different sub-printed circuit boards and the cables are positioned on the different printed circuit boards.

In addition, it is difficult to use the detection circuit because the RF performance is degraded in case that a distance between RF connectors on the sub-printed circuit board is long even though the plurality of RF lines of the main printed circuit board (PCB) is connected to the same sub-printed circuit board and the cables are positioned on the same printed circuit board.

Aspects of the disclosure are to address at least the above-mentioned problems and/or disadvantages and to provide at least the advantages described below. Accordingly, an aspect of the disclosure is to provide an electronic device including a cable connection circuit and a method of detecting an engaged state of the cable connection circuit.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a first printed circuit board positioned in the housing and including a first antenna, a first connector connected to the first antenna, a second antenna, and a second connector connected to the second antenna, memory storing one or more computer programs, a second printed circuit board disposed in the housing, spaced apart from the first printed circuit board, and including a power management circuit, a third connector electrically connected to the first connector, a fourth connector electrically connected to the second connector, a first detection circuit, and one or more processors communicatively coupled to the first detection circuit and the memory, a first cable configured to electrically connect the first connector and the third connector, and a second cable configured to electrically connect the second connector and the fourth connector, wherein the first detection circuit includes a first resistor positioned between the one or more processors and the power management circuit, and wherein the first printed circuit board includes a second resistor branching off between the first antenna and the first connector and electrically connected to the ground, and a third resistor branching off between the second antenna and the second connector and electrically connected to the ground.

In accordance with another aspect of the disclosure, one or more non-transitory computer-readable storage media storing computer-executable instructions that, when executed by one or more processors of an electronic device, cause the electronic device to perform operations of inspecting a cable connection circuit of the electronic device are provided. The cable connection circuit of the electronic device includes a first printed circuit board comprising a first antenna, a first connector connected to the first antenna, a second antenna, and a second connector connected to the second antenna, a second printed circuit board spaced apart from the first printed circuit board and comprising a power management circuit, a third connector electrically connected to the first connector, a fourth connector electrically connected to the second connector, a first detection circuit, and a processor operatively connected to the first detection circuit, a first cable configured to electrically connect the first connector and the third connector, and a second cable configured to electrically connect the second connector and the fourth connector, wherein the first detection circuit comprises a first resistor positioned between the processor and the power management circuit, and wherein the first printed circuit board includes a second resistor branching off between the first antenna and the first connector and electrically connected to the ground, and a third resistor branching off between the second antenna and the second connector and electrically connected to the ground, the operations comprising supplying a first voltage to the first antenna and the second antenna by using the power management circuit, and determining whether the first cable and the second cable are engaged based on voltage values measured by using the first detection circuit.

In accordance with another aspect of the disclosure, a method of inspecting a cable connection circuit of an electronic device is provided. The method includes supplying a first voltage to the first antenna and the second antenna by using the power management circuit, and determining whether the first cable and the second cable are engaged based on voltage values measured by using the first detection circuit.

According to various embodiments of the disclosure, the electronic device uses the single detection circuit to identify whether the plurality of cables is normally engaged.

According to various embodiments of the disclosure, the electronic device identifies whether the cables are normally engaged even in case that the plurality of RF lines are respectively connected to different sub-printed circuit boards, and the electronic device identifies whether the cables are normally engaged even in case that a distance between the RF connectors is long.

According to various embodiments of the disclosure, in case that the cable is not engaged, the electronic device forcibly blocks the band using the cable line as a transmitting end, thereby reducing power consumption caused by band searching. In addition, the electronic device provides the user with the guide indicating that the cable needs to be repaired.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a block diagram illustrating a configuration of an electronic device according to an embodiment of the disclosure;

FIG. 3A is a circuit diagram for detecting whether a cable of an electronic device according to an embodiment of the disclosure;

FIG. 4A is a view illustrating a cable engagement state detection circuit of an electronic device according to an embodiment of the disclosure;

FIG. 4B is a view illustrating a method of detecting a cable engagement state when an electronic device includes two cables according to an embodiment of the disclosure;

FIGS. 5A and 5B are flowcharts of a method of detecting an engaged state of an electronic device according to various embodiments of the disclosure;

FIG. 6B is a view illustrating a method of detecting a cable engagement state when an electronic device includes three cables according to an embodiment of the disclosure.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
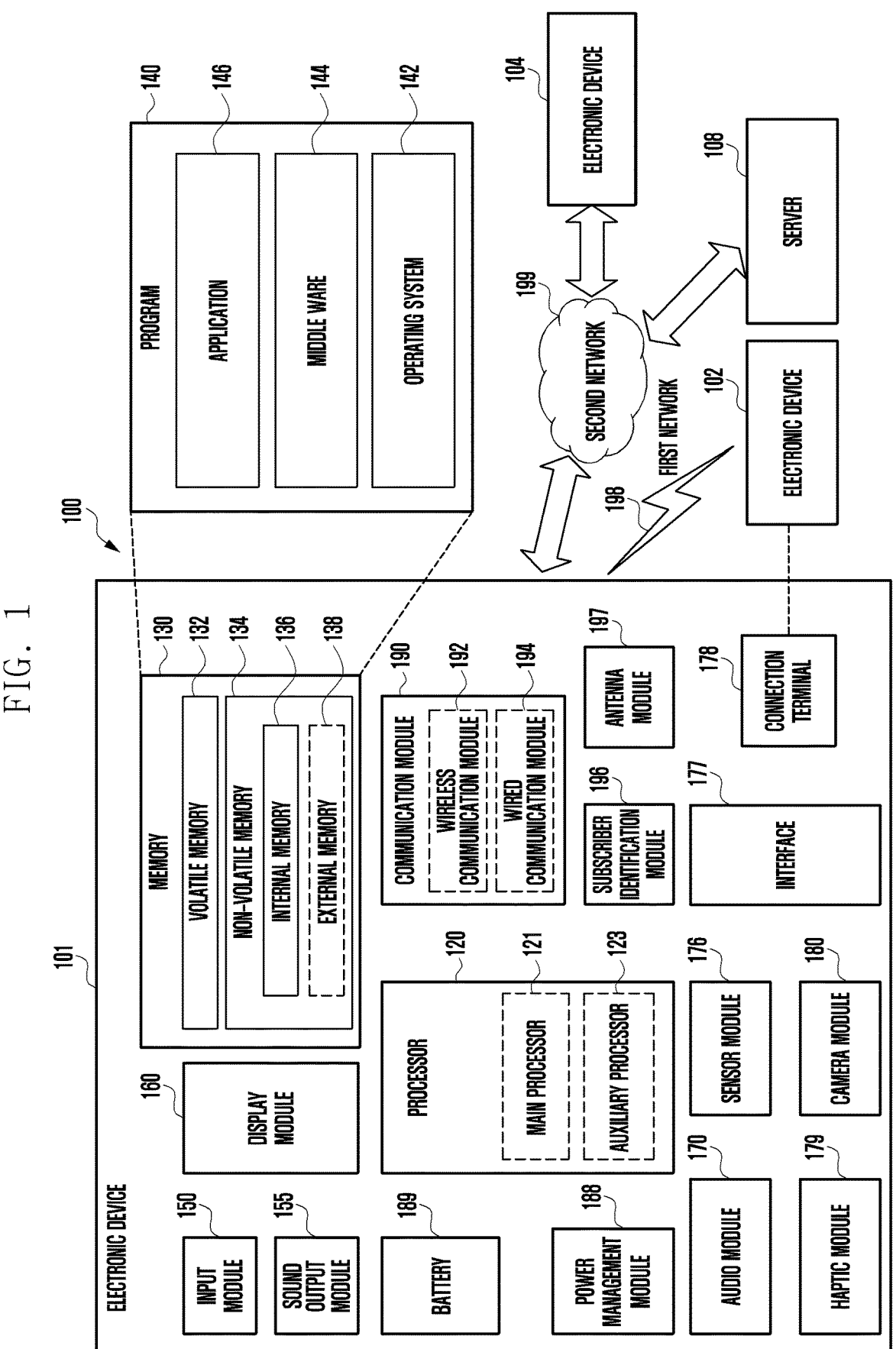
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers.

The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter-wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element includes a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

FIG. 2 is a block diagram illustrating a configuration of an electronic device according to an embodiment of the disclosure.

Referring to FIG. 2, according to various embodiments of the disclosure, an electronic device 200 may include a plurality of antennas (e.g., a first antenna 211 and a second antenna 212), RF integrated circuit (RFIC) 215, a processor 220, a plurality of cables (e.g., a first cable 231 and a second cable 232), a power management circuit 240, and a plurality of resistors R1, R2, and R3.

The electronic device 200 may further include at least some of the configurations and/or functions of the electronic device 101 in FIG. 1. At least some of the illustrated (or non-illustrated) components of the electronic device may be operatively, functionally, and/or electrically connected to one another.

According to various embodiments of the disclosure, an RFIC 215 may perform various operations to process a signal received from the processor 220. For example, the RFIC 215 may perform an operation of modulating a signal received from the processor 220. For example, the RFIC 215 may perform a frequency modulation operation that converts a baseband signal into a radio frequency (RF) signal utilized for cellular communications. The first RFIC 215 may perform an operation of demodulating a signal received from the outside through the first antenna 211 and/or the second antenna 212. For example, the RFIC 215 may perform a frequency demodulation operation that converts a radio frequency (RF) signal to a baseband signal.

According to various embodiments of the disclosure, the processor 220 may be configured as one or more processors configured to control the components of the electronic device 200 and/or perform computation or data processing related to communication. The processor 220 may include at least some of the configurations and/or functions of the processor 120 in FIG. 1.

According to various embodiments of the disclosure, the processor 220 is not limited to computation and data processing functions that may be implemented in the electronic device 200. However, hereinafter, an operation of determining engaged states of a plurality of cables by receiving voltages from a detection circuit will be described below. The operations of the processor 220 may be performed by loading instructions stored in memory (not illustrated).

According to various embodiments of the disclosure, the processor 220 may be electrically connected to the RFIC 215. In various embodiments of the disclosure, the processor 220 may create or configure information to be included in a signal to be transmitted to an external electronic device through the antenna (e.g., the first antenna 211). In various embodiments of the disclosure, the processor 220 may identify or acquire information included in a signal received from the external electronic device through the antenna 211.

According to various embodiments of the disclosure, the first cable 231 may electrically connect the first antenna 211 and the RFIC 215. The first cable 231 may include a first connector (not illustrated) positioned in a direction of the first antenna 211 based on the first cable 231, and a third connector (not illustrated) positioned in a direction of the RFIC 215 direction based on the first cable 231.

According to various embodiments of the disclosure, the second cable 232 may electrically connect the second antenna 212 and the RFIC 215. The second cable 232 may include a second connector (not illustrated) positioned in a direction of the second antenna 212 based on the second cable 232, and a fourth connector (not illustrated) positioned in a direction of the RFIC 215 based on the second cable 232.

According to various embodiments of the disclosure, the power management circuit (power management integrated circuit) 240 may apply a direct current (DC) voltage (e.g., reference voltage Vdc) to the electronic device 200. The processor 220 may use an analog digital converter (ADC) port to measure a voltage value on a node connected to the first resistor R1 when viewed in the direction of the first resistor R1. The processor 220 may determine engaged states of the first cable 231 and the second cable 232 based on the measured voltage values. The number of cables, the engaged states of which may be determined by the processor 220, may not be limited thereto.

According to various embodiments of the disclosure, the electronic device 200 may include the first resistor R1, the second resistor R2, and the third resistor R3. The number of resistors included in the electronic device 200 is not limited thereto. The number of resistors may vary in proportion to the number of cables.

The first resistor R1 may be positioned on an electrical path between the power management circuit 240 and the processor 220. The second resistor R2 may be positioned on an electrical path between the first antenna 211 and the first cable 231 and connected to the ground (not illustrated). The third resistor R3 may be positioned on an electrical path between the second antenna 212 and the second cable 232 and connected to the ground (not illustrated).

Figure 3A:
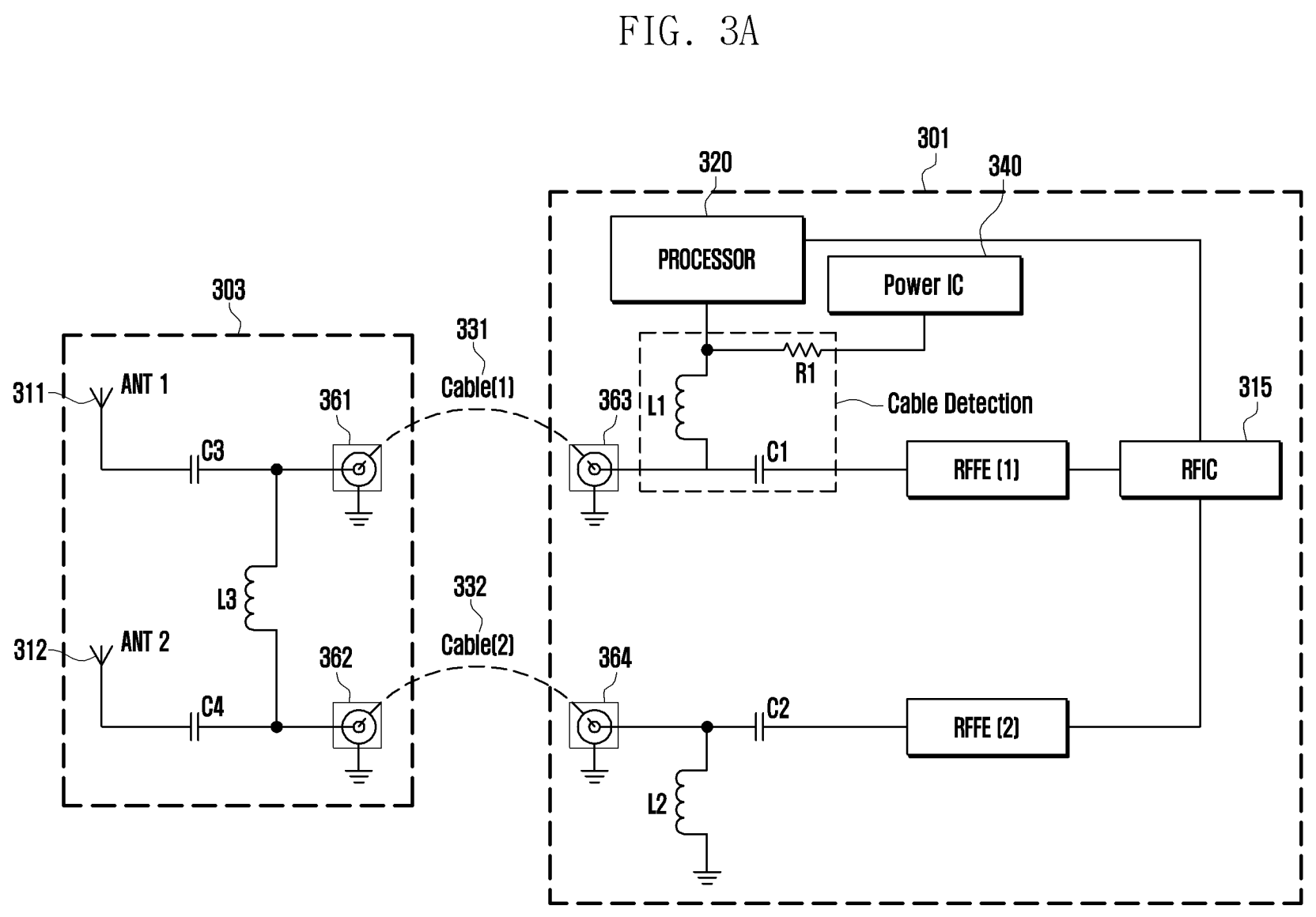

FIG. 3A is a circuit diagram for detecting whether a cable of an electronic device according to an embodiment of the disclosure.

The electronic device according to the comparative example may include components almost similar to the components of the electronic device 200 in FIG. 2. However, the electronic device 200 in FIG. 2 may further include the second resistor R2 and the third resistor R3 in FIG. 2 in comparison with the electronic device according to the comparative example.

Figure 3B:
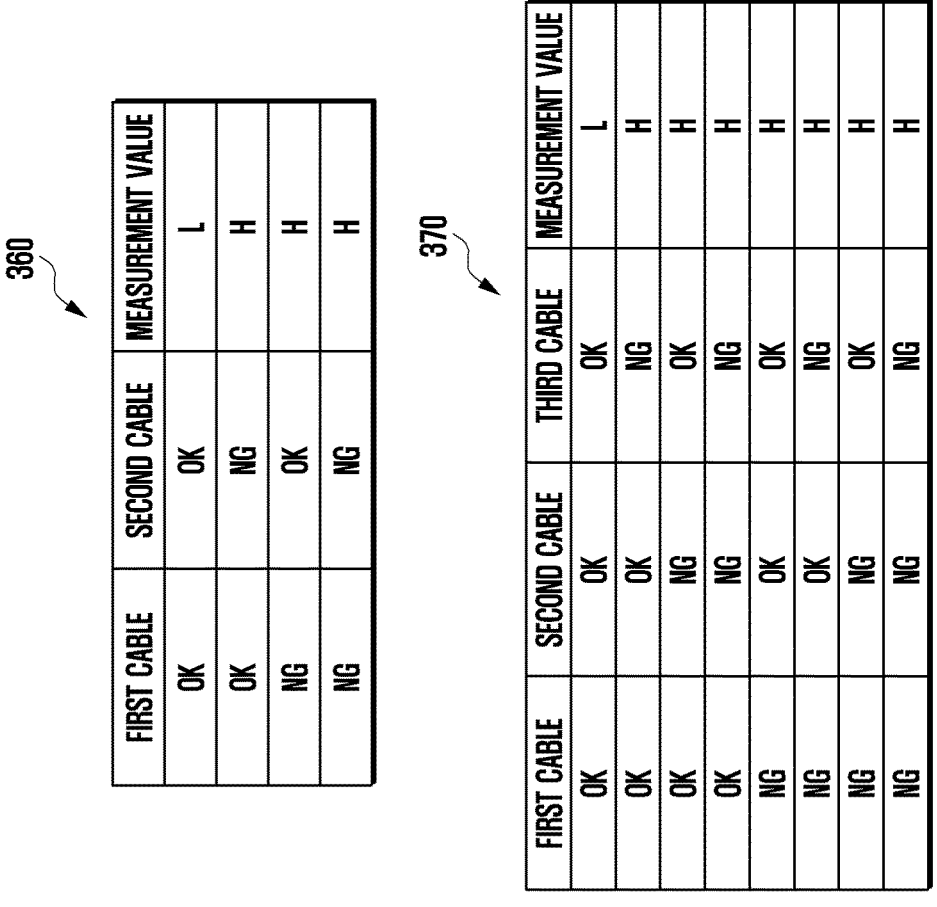
FIG. 3B is a flowchart and a table for explaining a method of detecting whether a cable of an electronic device according to an embodiment of the disclosure.
Figure 3B:
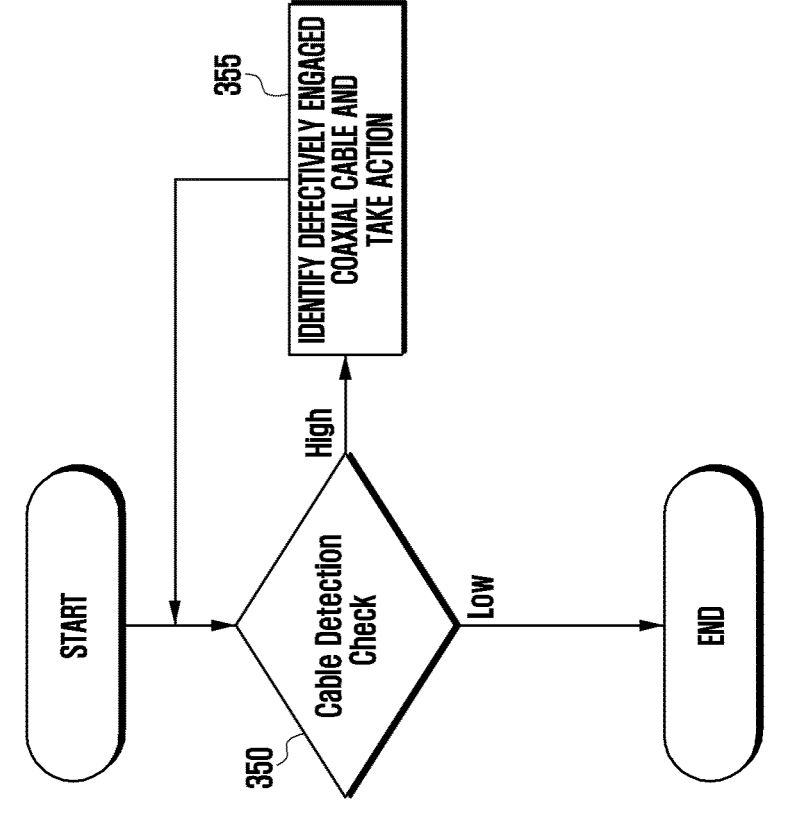

Referring to FIG. 3A, a power management circuit 340 may apply a reference voltage to the electronic device. A processor 320 may detect whether a first cable 331 and a second cable 332 connected to the fourth connector 364 (464 in FIG. 4A) are engaged based on voltages measured on the node connected to the first resistor R1. The detection method will be described with reference to FIG. 3B.

FIG. 3B is a flowchart and a table illustrating a method of detecting whether a cable of an electronic device according to an embodiment of the disclosure.

Referring to FIG. 3B, at operation 350, the processor 320 may detect the engaged states of the cables. The principle on which the processor 320 detects the engaged states of the cables will be described below.

Table 360 shows the engaged states of the cables when it is assumed that the electronic device has two cables (e.g., a first cable 321 and a second cable 322), as illustrated in FIG. 3A. In case that all the cables are normally engaged, the power management circuit 340 may be connected to the ground in the vicinity of a third connector 363 (463 in FIG. 4A)via a first inductor L1 and the third connector 363. In addition, the power management circuit 340 may be connected to the ground via a first connector 361 (461 in FIG. 4A), a third inductor L3, the second cable 332, and a second inductor L2. In this case, the node between the processor 320 and the first resistor R1 may be the ground in a DC manner. The processor 320 may detect Low L in respect to a DC measurement value.

Alternatively, in case that even one cable is not normally engaged, the node between the processor 320 and the first resistor R1 may be opened. In this case, the processor 320 may detect High H in respect to a DC measurement value.

Table 370 shows the engaged states of the cables when it is assumed that the number of cables is three, unlike the electronic device in FIG. 3A. In case that all the cables are normally engaged, the power management circuit 340 may be connected to the ground, as in the case in which the number of cables is two. In this case, the node between the processor 320 and the first resistor R1 may be the ground in a DC manner. The processor 320 may detect Low L in respect to a DC measurement value.

Alternatively, in case that even one cable is not normally engaged, the node between the processor 320 and the first resistor R1 may be opened, as in the case in which the number of cables is two. In this case, the processor 320 may detect High H in respect to a DC measurement value. In FIG. 3B, the description is made on the assumption that the number of cables is two or three. However, the number of cables is not limited thereto.

According to the embodiment of the disclosure, at operation 355, the processor 320 may take an appropriate action when the processor 320 determines defective engaged states of the cables. For example, in case that an engaged state of at least any one of the plurality of cables is defective, the processor 320 may provide a guide for informing the user of the defective engaged state.

However, in case that the circuit in FIG. 3A is used, the measurement values in Table 360 to Table 370 may be measured only as Low L or High H. The processor 320 may detect whether all the cables are normally engaged based on the measurement values in Table 360 to Table 370. However, in case that all the cables are not normally engaged, it may be difficult to recognize which cable is not normally engaged among the plurality of cables. Because of this limitation, the processor 320 may have difficulty in providing an accurate guide to inform the user of which cable is not engaged. The user may need to independently inspect the engaged states of the plurality of cables in order to recognize which cable is in a defectively engaged state. In this case, as the number of cables increases, it may be difficult to identify the engaged states of the individual cables.

Figure 3C:
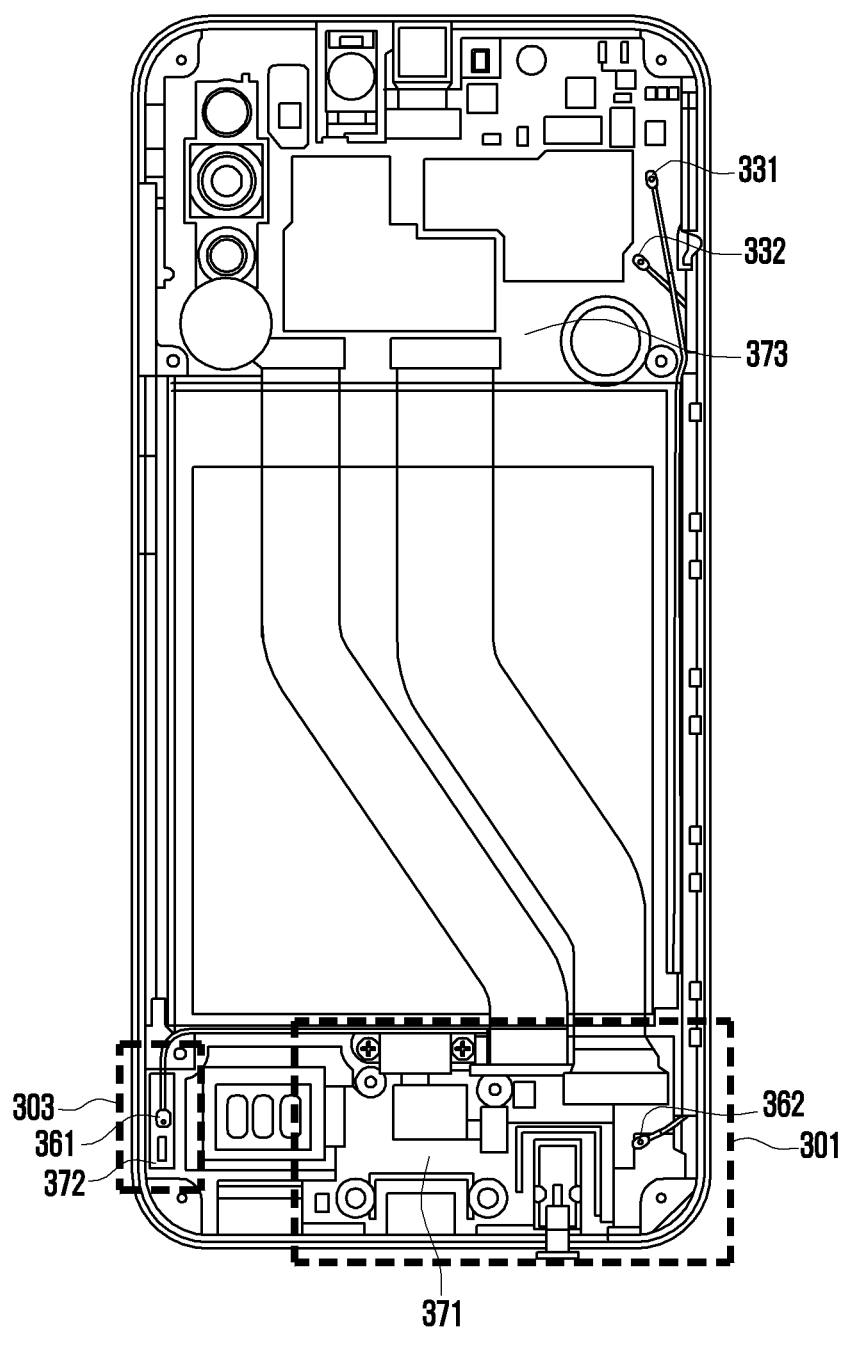
FIGS. 3C and 3D are views illustrating an internal configuration of an electronic device according to various embodiments of the disclosure.
Figure 3D:
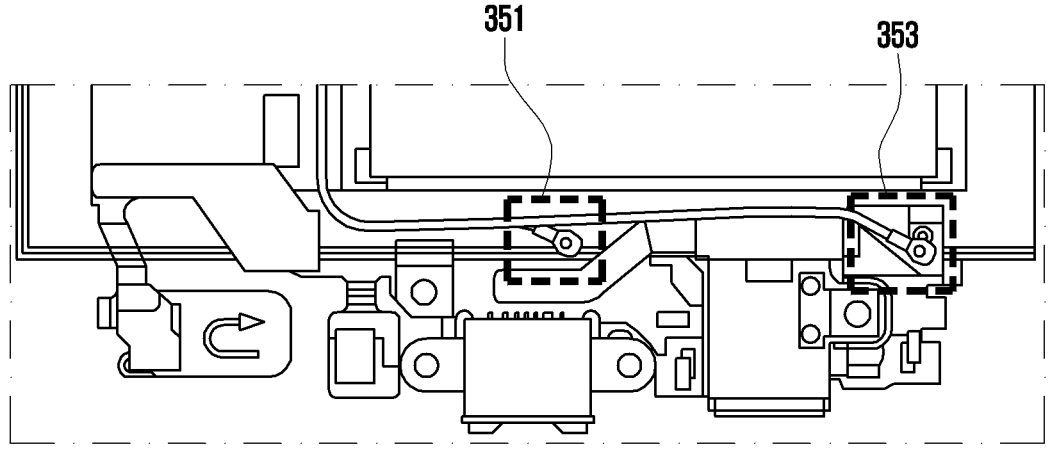

FIGS. 3C and 3D are views illustrating an internal configuration of an electronic device according to various embodiments of the disclosure.

Referring to FIG. 3C, the electronic device may include a plurality of printed circuit boards (e.g., main printed circuit board (not illustrated), a first printed circuit board (first PCB) 371, a second printed circuit board (second PCB) 372, and a third printed circuit board (third PCB) 373. In case that a plurality of RF (radio frequency) lines on the main printed circuit board is independently connected to the printed circuit boards, it may be difficult to use the detection circuit in FIG. 3A. For example, the detection circuit in FIG. 3A may be used only when a first antenna 311 and a second antenna 312 are positioned on the single printed circuit board. In addition, the electronic device may include a first area 301 including the first printed circuit board (first PCB) 371 on which the first connector 361 is disposed, and a second area 303 including the second printed circuit board (second PCB) 372 on which a second connector 362 (462 in FIG. 4A) is disposed. The first connector 361 may be electrically connected to the first antenna 311 included in the first area 301. In addition, the second connector 362 may be electrically connected to the second antenna 312 included in the second area 303.

In addition, referring to FIG. 3D, the electronic device according to the comparative example may include a plurality of connectors (e.g., a first connector 351 and a second connector 353). The plurality of connectors (e.g., the first connector 361 and the second connector 362) may be disposed on the single printed circuit board (e.g., the first PCB). Alternatively, the plurality of connectors (e.g., the first connector 361 and the second connector 362) may be disposed on separate printed circuit boards (e.g., the first PCB 371 and the second PCB 372). For example, the first connector 361 may be disposed on the first PCB 371, and the second connector 362 may be disposed on the second PCB 372. In case that a distance between the first connector 361 and the second connector 362 exceeds a predetermined distance, a distance between the second antenna 312 and the third inductor L3 may also exceed the predetermined distance. In this case, the RF performance of the second antenna 312 may be decreased by the third inductor L3. Alternatively, in case that a distance between the first antenna 311 and the third inductor L3 exceeds a predetermined distance, the RF performance of the first antenna 311 may be decreased by the third inductor L3.

The electronic device and a cable engagement state detection circuit of the electronic device according to various embodiments of the disclosure may overcome the above-mentioned limitations. The electronic device and a method of detecting an engaged state of the electronic device will be described with reference to FIGS. 4A, 4B, 5A, and 5B.

Figure 4A:
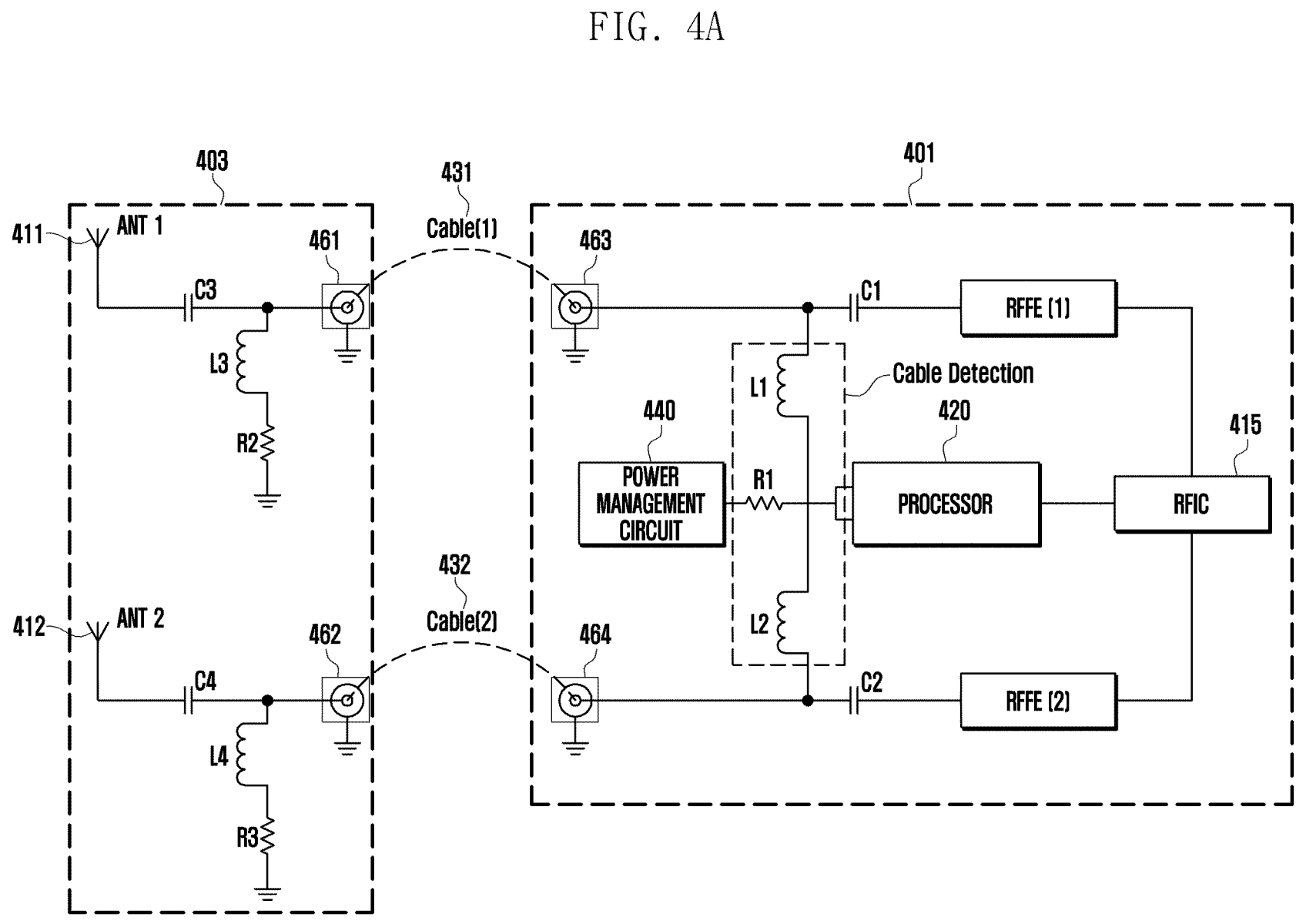

FIG. 4A is a view illustrating a cable engagement state detection circuit of an electronic device according to an embodiment of the disclosure.

Referring to FIG. 4A, the detection circuit may include the components of the detection circuit in FIG. 3A. However, unlike the detection circuit in FIG. 3A, in the detection circuit in FIG. 4A, the second inductor L2 may be connected to a node between a processor 420 and the first resistor R1. In the detection circuit in FIG. 3A, the second inductor L2 is connected to the ground. In contrast, in the detection circuit in FIG. 4A, the second inductor L2 may be connected to the node between the processor 420 and the first resistor R1.

The node between the processor 420 and the first resistor R1 may be electrically connected to a second cable 432 and a second antenna 412 through the second inductor L2. The processor 420 may detect engaged states of a first cable 431 and the second cable 432 in response to the measurement of a voltage applied to the first resistor R1 on the node between the first resistor R1 and the processor 420.

In addition, in the detection circuit in FIG. 3A, the third inductor L3 is positioned between the first antenna 311 and the second antenna 312. In contrast, in the detection circuit located in a first area 401 in FIG. 4A, the third inductor L3 may be connected between a first antenna 411 and the second resistor R2. The detection circuit in FIG. 4A may further include the second resistor R2. The second resistor R2 may be connected to the third inductor L3 and the ground.

The detection circuit in FIG. 4A may further include the third resistor R3 and a fourth inductor L4. The fourth inductor L4 may be positioned between the second antenna 412 and the third resistor R3. The third resistor R3 may be positioned between the fourth inductor L4 and the ground. In case that the second cable 432 is engaged, a voltage generated from a power management circuit 440 may be distributed between the third resistor R3 and at least any one of the first resistor R1 and the second resistor R2. In addition, in case that the first cable 431 is engaged, the voltage generated from the power management circuit 440 may be distributed between the second resistor R2 and at least any one of the first resistor R1 and the third resistor R3. This will be described with reference to FIG. 4B.

According to the embodiment of the disclosure, the third inductor L3 may transmit only a DC component to the second resistor R2 and block an RF component. A third capacitor C3 may block the DC component directed toward the first antenna 411 and transmit only the RF component to the first antenna 411.

According to the embodiment of the disclosure, the fourth inductor L4 may transmit only the DC component to the third resistor R3 and block the RF component. A fourth capacitor C4 may block the DC component directed toward the second antenna 412 and transmit only the RF component to the second antenna 412.

According to the embodiment of the disclosure, an RFIC 415 (or 315 in FIG. 3A) may be electrically connected to a third connector 463 located in a second area 403 or connected to the third connector 463 through at least one electrical element. In various embodiments of the disclosure, the RFIC 415 may be electrically connected to the processor 420. In the electronic device 200, data created from the processor 220 are subjected to signal processing via the radio frequency integrated circuit (RFIC) 415 and a radio frequency front end (RFFE) circuit (hereinafter, for convenience of description, referred to as 'RFFE') and then to the outside of the electronic device through the antennas 411 and 412. The RFFE circuit may be connected to a single antenna or a plurality of antennas and create a plurality of antenna transmission paths (antenna tx path) corresponding to the plurality of antennas. For example, an RFFE 1 may be connected to the first antenna 411 and define a first antenna transmission path. An RFFE 2 may be connected to the second antenna 412 and define a second antenna transmission path.

A first capacitor C1 may be positioned between the RFFE 1 and the first antenna 411, and a second capacitor C2 may be positioned between the RFFE 2 and the second antenna 412. The first capacitor C1 and the second capacitor C2 may serve to transmit only the RF component of the power supplied through the power management circuit 440 and block the introduction of the DC component.

The first inductor L1 may be positioned between the first antenna transmission path and the processor 420, and the second inductor L2 may be positioned between the second antenna transmission path and the processor 420. The first inductor L1 and the second inductor L2 may serve to transmit only the DC component on the processor 420 or the power management circuit 440 and block the introduction of the RF signal.

FIG. 4B is a view illustrating a method of detecting a cable engagement state when an electronic device includes two cables according to an embodiment of the disclosure.

Referring to FIG. 4B, in Cases 1 to 4, the processor 420 may measure the voltage applied to the first resistor R1 on the node between the first resistor R1 and the processor 420. A measurement value 435 indicates a value made by measuring, by the processor 420, a voltage distributed to the first resistor R1 in Cases 1 to 4.

In case that the first cable 431 is engaged, the voltage generated from the power management circuit 440 may be distributed between the second resistor R2 and at least any one of the first resistor R1 and the third resistor R3.

According to the embodiment of the disclosure, Case 2 indicates a situation in which the first cable 431 is engaged, and the second cable 432 is not engaged. In Case 2, the power management circuit 440 may be connected to the ground via the first resistor R1 and the second resistor R2 in a DC manner. In this case, the processor 420 may identify that the reference voltage Vdc is distributed in a predetermined range by a ratio of the second resistor R2 or based on a ratio of the second resistor R2 between the first resistor R1 and the second resistor R2. In this case, the reference voltage Vdc may mean a voltage supplied to the electronic device 200 from the power management circuit 440. In this case, the measurement value 435 may be within a predetermined range or be as follows.

$$\text{Measurement Value } 435 = \text{Reference Voltage}$$
$$Vdc*\{R2/(R1+R2)\} \text{ by Case 2}$$

According to the embodiment of the disclosure, Case 3 indicates a situation in which the second cable 432 is engaged, and the first cable 431 is not engaged. In Case 3, the power management circuit 440 may be connected to the ground via the first resistor R1 and the third resistor R3 in a DC manner. In this case, the processor 420 may identify that the reference voltage Vdc is distributed in a predetermined range by a ratio of the third resistor R3 or based on a ratio of the third resistor R3 between the first resistor R1 and the third resistor R3. In this case, the measurement value 435 may be within a predetermined range or be as follows.

$$\text{Measurement Value } 435 = \text{Reference Voltage}$$
$$Vdc*\{R3/(R1+R3)\} \text{ by Case 3}$$

In addition, Case 4 may mean a situation in which both the first cable 431 and the second cable 432 are not engaged. In Case 4, the power management circuit 440 may be opened in a DC manner. In this case, the first resistor R1 may be connected to the power management circuit 440 and the processor 420 in series. In this case, the processor 420 may identify the reference voltage Vdc on the first resistor R1 or a voltage within a predetermined range on the reference voltage Vdc. In this case, the measurement value 435 may be within a predetermined range or be as follows.

$$\text{Measurement Value } 435 = \text{Reference Voltage } Vdc \text{ by}$$
$$\text{Case 4}$$

In addition, Case 1 may mean a situation in which both the first cable 431 and the second cable 432 are engaged. In Case 1, the power management circuit 440 may be connected to the ground via the first resistor R1, the second resistor R2, and the third resistor R3 in a DC manner. In this case, the second resistor R2 and the third resistor R3 may be connected in parallel based on the node between the processor 420 and the first resistor R1. In this case, the processor 420 may identify that the reference voltage Vdc is distributed in a predetermined range by a ratio between values (R2/R3) of the resistors connected in parallel or based on the ratio between the values (R2/R3) of the resistors connected in parallel between the values (R2/R3) of the first resistor R1, the second resistor R2, and the third resistor R3 connected in parallel. In this case, the measurement value 435 may be within a predetermined range or be as follows.

$$\text{Measurement Value } 435 = \text{Reference Voltage } Vdc*\{$$
$$(R2/R3)/(R1+R2/R3)\} \text{ by Case 1}$$

FIGS. 5A and 5B are flowcharts of a method of detecting an engaged state of an electronic device according to various embodiments of the disclosure.

The operations to be described with reference to FIGS. 5A and 5B may be implemented based on instructions that may be stored in a computer recording medium or memory (not illustrated). An illustrated method 500 may be performed by the electronic device (e.g., the electronic device 200 in FIG.

2) described above with reference to FIGS. 1, 2, 3A, 3B, 3C, 3D, 4A, and 4B, and a description of the above-mentioned technical feature will be omitted.

Referring to FIGS. 5A and 5B, at operations 510 and 530, the processor (e.g., the processor 420 in FIG. 4A) may identify the measurement value (e.g., the measurement value 435 in FIG. 4B). In Cases 1 to 4 in FIG. 4B, the measurement value 435 may mean a value made by measuring, by the processor 420, a voltage distributed to the first resistor R1. In case that the measurement value 435 is identified as a first value, the processor 420 may determine that both the first cable (e.g., the first cable 431 in FIGS. 4A and 4B) and the second cable (e.g., the second cable 432 in FIGS. 4A and 4B) are normally engaged, and then the processor 420 may end the detection process. The first value may mean a voltage value when the reference voltage Vdc is distributed by the ratio between the values (R2/R3) of the resistors connected in parallel between the values (R2/R3) of the first resistor R1, the second resistor R2, and the third resistor R3 connected in parallel. Alternatively, the first value may mean the measurement value 435 in Case 1 in FIG. 4B.

Measurement Value 435=Reference Voltage $Vdc^*\{(R2/R3)/(R1+R2/R3)\}$ by Case 1

The reference voltage Vdc may mean a voltage supplied to the electronic device 200 from the power management circuit (e.g., the power management circuit 440 in FIG. 4A).

In case that the first value is not measured at operation 510, the processor 420, at operation 515, may determine whether the measurement value 435 is a third value. The third value may mean a voltage value when the reference voltage Vdc is distributed by a ratio of the third resistor R3 between the first resistor R1 and the third resistor R3. Alternatively, the third value may mean the measurement value 435 in Case 3 in FIG. 4B.

Measurement Value 435=Reference Voltage $Vdc^*\{R3/(R1+R3)\}$ by Case 3

In case that the measurement value 435 is identified as the third value, the processor 420 may determine that the second cable 432 is normally engaged, and the first cable 431 is not normally engaged.

In this case, at operation 521, the processor 420 may identify the engaged state of the first cable 431 and take an appropriate action. For example, at operation 541, the processor 420 may block a band of the first antenna 411 using the first cable 431 as the electrical path. In this case, the processor 420 may prevent power consumption required to find the non-engaged band. In addition, the processor 420 may provide a guide indicating that the first cable 431 is in a defective engaged state and needs to be repaired.

In case that the third value is not measured at operations 515 and 535, the processor 420, at operation 520, may determine whether the measurement value 435 is a second value. The second value may mean a voltage value when the reference voltage Vdc is distributed by a ratio of the second resistor R2 between the first resistor R1 and the second resistor R2. Alternatively, the second value may mean the measurement value 435 in Case 2 in FIG. 4B.

Measurement Value 435=Reference Voltage $Vdc^*\{R2/(R1+R2)\}$ by Case 2

In case that the measurement value 435 is identified as the second value, the processor 420 may determine that the first cable 431 is normally engaged, and the second cable 432 is not normally engaged.

In this case, at operation 523, the processor 420 may identify the engaged state of the second cable 432 and take an appropriate action. For example, at operation 542, the processor 420, at operation 542, may block a band of the second antenna 412 using the second cable 432 as the electrical path. In this case, the processor 420 may prevent power consumption required to find the non-engaged band. In addition, the processor 420 may provide a guide indicating that the second cable 432 is in a defective engaged state and needs to be repaired.

In case that the second value is not measured at operations 520 and 540, the processor 420 may determine that both the first cable 431 and the second cable 432 are not normally engaged. In this case, at operation 525, the processor 420 may identify the engaged states of the first cable 432 and the second cable 432 and take an appropriate action. For example, the processor 420, at operation 541, may block the bands of the first antenna 411 and the second antenna 412 using the first cable 432 and the second cable 432 as the electrical paths. In this case, the processor 420 may prevent power consumption required to find the non-engaged band. In addition, the processor 420 may provide a guide indicating that the first cable 432 and the second cable 432 are in a defective engaged state and need to be repaired. Alternatively, the processor 420 may provide a guide (e.g., a pop-up screen) for the user to visit a service center for repair.

Figure 6A:
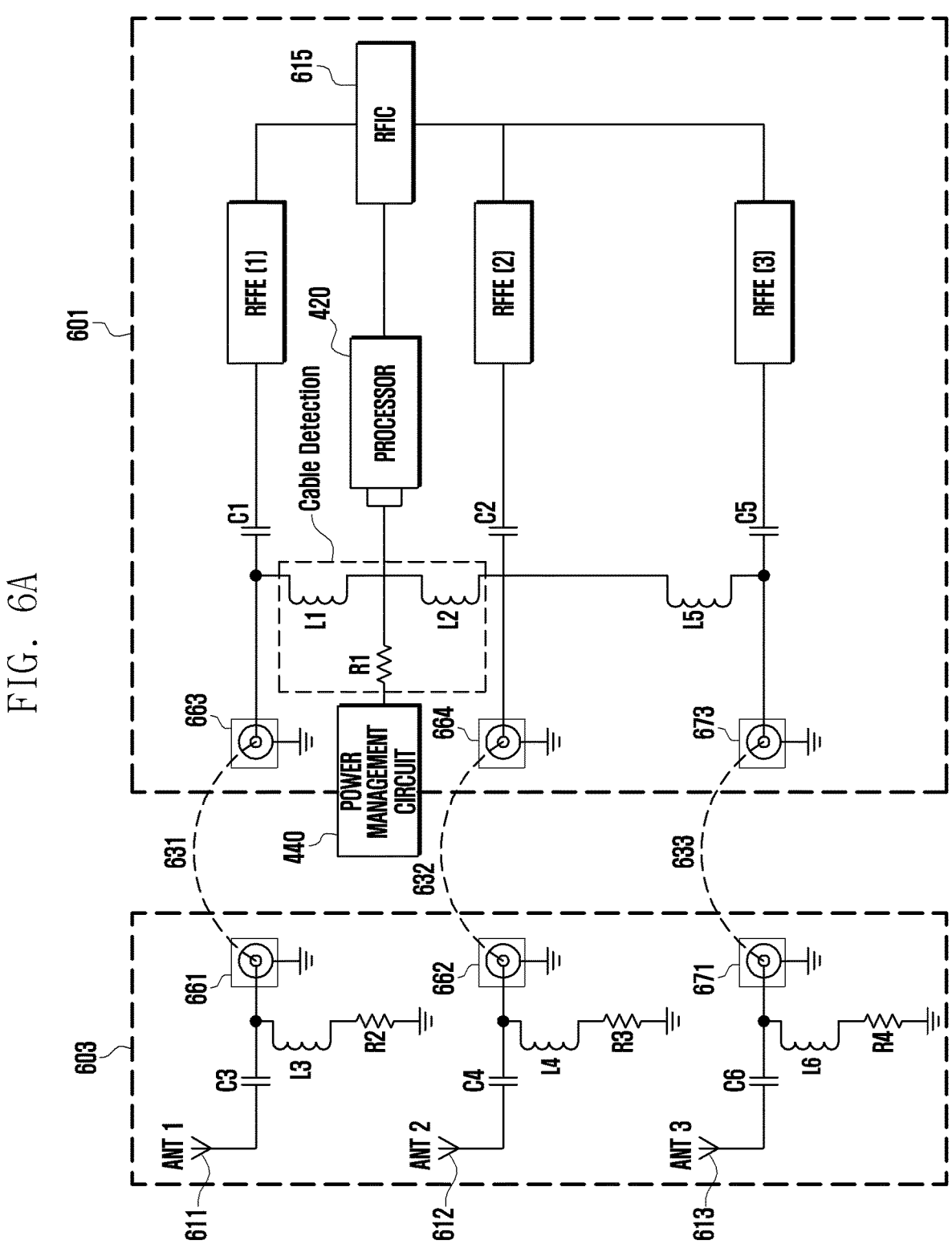
FIG. 6A is a view illustrating a cable engagement state detection circuit of an electronic device according to an embodiment of the disclosure.

FIG. 6A is a view illustrating a cable engagement state detection circuit of an electronic device according to an embodiment of the disclosure.

Referring to FIG. 6A, the detection circuit may include the components of the detection circuit in FIG. 3A. However, unlike the detection circuit in FIG. 3A, in the detection circuit in FIG. 4A, the second inductor L2 may be connected to the node between the processor 420 and the first resistor R1. In the detection circuit in FIG. 3A, the second inductor L2 is connected to the ground. In contrast, in the detection circuit in FIG. 6A, the second inductor L2 may be connected to the node between the processor 420 and the first resistor R1.

The node between the processor 420 and the first resistor R1 may be electrically connected to the second cable 632 (connecting second connector 662 and fourth connector 664) and the second antenna 612 through the second inductor L2. The processor 420 may detect engaged states of the first cable 631 (connecting first connector 661 and third connector 663) and the second cable 632 in response to the measurement of the voltage applied to the first resistor R1 on the node between the first resistor R1 and the processor 420.

In addition, in the detection circuit in FIG. 3A, the third inductor L3 is positioned between the first antenna 611 located in a first area 603 and the second antenna 612. In contrast, in the detection circuit in FIG. 4A, the third inductor L3 may be connected between the first antenna 411 and the second resistor R2. The detection circuit in FIG. 4A may further include the second resistor R2. The second resistor R2 may be connected to the third inductor L3 and the ground.

The detection circuit in FIG. 6A may further include the third resistor R3 and the fourth inductor L4. The fourth inductor L4 may be positioned between the second antenna 612 and the third resistor R3. The third resistor R3 may be positioned between the fourth inductor L4 and the ground. In case that the second cable 632 is engaged, the voltage generated from the power management circuit 440 may be distributed between the third resistor R3 and at least any one of the first resistor R1 and the second resistor R2. In addition, in case that the first cable 632 is engaged, the voltage generated from the power management circuit 440 may be distributed between the second resistor R2 and at least any one of the first resistor R1 and the third resistor R3.

According to the embodiment of the disclosure, the third inductor L3 may transmit only the DC component to the second resistor R2 and block the RF component. The third capacitor C3 may block the DC component directed toward the first antenna 611 and transmit only the RF component to the first antenna 611.

According to the embodiment of the disclosure, the fourth inductor L4 may transmit only the DC component to the third resistor R3 and block the RF component. The fourth capacitor C4 may block the DC component directed toward the second antenna 612 and transmit only the RF component to the second antenna 612.

According to the embodiment of the disclosure, the RFIC 615 may be electrically connected to the third connector 663 located in a second area 601 or connected to the third connector 663 through at least one electrical element. In various embodiments of the disclosure, the RFIC 615 may be electrically connected to the processor 420. In the electronic device 200, data created from the processor 220 are subjected to signal processing via the radio frequency integrated circuit (RFIC) 615 and the radio frequency front end (RFFE) circuit (hereinafter, for convenience of description, referred to as 'RFFE') and then to the outside of the electronic device through the antennas 611 and 612. The RFFE circuit may be connected to a single antenna or a plurality of antennas and create a plurality of antenna transmission paths (antenna tx path) corresponding to the plurality of antennas. For example, the RFFE 1 may be connected to the first antenna 611 and define the first antenna transmission path. The RFFE 2 may be connected to the second antenna 612 and define the second antenna transmission path.

The first capacitor C1 may be positioned between the RFFE 1 and the first antenna 611, and the second capacitor C2 may be positioned between the RFFE 2 and the second antenna 612. The first capacitor C1 and the second capacitor C2 may serve to transmit only the RF component of the power supplied through the power management circuit 440 and block the introduction of the DC component.

The first inductor L1 may be positioned between the first antenna transmission path and the processor 420, and the second inductor L2 may be positioned between the second antenna transmission path and the processor 420. The first inductor L1 and the second inductor L2 may serve to transmit only the DC component on the processor 420 or the power management circuit 440 and block the introduction of the RF signal.

Unlike the circuit in FIG. 4B, the detection circuit in FIG. 6A may include a situation in which the number of antennas is three. The number of antennas, which may be included in the circuit, is not limited thereto. The operation of the detection circuit may be maintained by adding electric elements, including connectors, cables, resistors, inductors, and capacitors, to the extent that the number of antennas increases.

The detection circuit in FIG. 6A may further include a third antenna 613. In addition, the detection circuit in FIG. 6A may further include a fourth resistance R4 and a sixth inductor L6. The sixth inductor L4 may be positioned between the third antenna 613 and the fourth resistance R4. The fourth resistance R4 may be positioned between a fourth inductor L6 and the ground. In case that a third cable 633 (connecting fifth connector 671 and sixth connector 673) is engaged, the voltage generated from the power management circuit 440 may be distributed between the first resistor R1 or the second resistor R2, the third resistor R3, and the fourth resistance R4. This will be described with reference to FIG. 6B.

According to the embodiment of the disclosure, the sixth inductor L6 may transmit only the DC component to the fourth resistance R4 and block the RF component. A sixth capacitor C6 may perform control to block the DC component directed toward the third antenna 613 and transmit only the RF component to the third antenna 613.

FIG. 6B is a view illustrating a method of detecting a cable engagement state when an electronic device includes three cables according to an embodiment of the disclosure.

Referring to FIG. 6B, in Cases 1 to 8, the processor 420 may measure the voltage applied to the first resistor R1 on the node between the first resistor R1 and the processor 420. A measurement value 635 indicates a value made by measuring, by the processor 420, a voltage distributed to the first resistor R1 in Cases 1 to 8.

According to the embodiment of the disclosure, Case 1 may mean a situation in which all a first cable 631, a second cable 632, and the third cable 633 are engaged. In Case 1, the power management circuit 440 may be connected to the ground via the first resistor R1, the second resistor R2, the third resistor R3, and the fourth resistance R4 in a DC manner. In this case, the second resistor R2, the third resistor R3, and the fourth resistance R4 may be connected in parallel based on the node between the processor 420 and the first resistor R1. In this case, the processor 420 may identify that the reference voltage Vdc is distributed in a predetermined range by a ratio between values (R2/R3/R4) of the resistors connected in parallel or based on the ratio between the values (R2/R3/R4) of the resistors connected in parallel between the values (R2/R3/R4) of the first resistor R1, the second resistor R2, the third resistor R3, and the fourth resistance R4 are connected in parallel. In this case, the measurement value 635 may be within a predetermined range or be as follows.

$$\text{Measurement Value } 635 = \text{Reference Voltage } Vdc * \{ ((R2/R3/R4))/(R1+(R2/R3/R4)) \} \text{ by Case 1}$$

According to the embodiment of the disclosure, Case 2 indicates a situation in which the first cable 631 and the second cable 632 are engaged, and the third cable 633 is not engaged. In Case 2, the power management circuit 440 may be connected to the ground via the first resistor R1, the second resistor R2, and the third resistor R3 in a DC manner. In this case, the processor 420 may identify that the reference voltage Vdc is distributed in a predetermined range by a ratio (R2/R3) of the second resistor R2 and the third resistor R3 connected in parallel or based on the ratio (R2/R3) of the second resistor R2 and the third resistor R3 connected in parallel between the first resistor R1, the second resistor R2, and the third resistor R3. In this case, the reference voltage Vdc may mean a voltage supplied to the electronic device 200 from the power management circuit 440. In this case, the measurement value 635 may be within a predetermined range or be as follows.

$$\text{Measurement Value } 635 = \text{Reference Voltage } Vdc * \{ (R2/R3)/(R1+(R2/R3)) \} \text{ by Case 2}$$

According to the embodiment of the disclosure, Case 3 is a situation in which the first cable 631 and the third cable 633 are engaged, and the second cable 632 is not engaged. In Case 3, the power management circuit 440 may be connected to the ground via the first resistor R1, the second resistor R2, and the fourth resistor R4 in a DC manner. In this case, the processor 420 may identify that the reference voltage Vdc is distributed in a predetermined range by a ratio (R2/R4) of the second resistor R2 and the fourth resistor R4 connected in parallel or based on the ratio (R2/R4) of the second resistor R2 and the fourth resistor R4 connected in parallel between the first resistor R1, the second resistor R2, and the fourth resistor R4. In this case, the reference voltage Vdc may mean a voltage supplied to the electronic device 200 from the power management circuit 440. In this case, the measurement value 635 may be within a predetermined range or be as follows.

Measurement Value 635=Reference Voltage $Vdc*\{$ $(R2/R4)/(R1+(R2/R4))\}$ by Case 3

According to the embodiment of the disclosure, Case 4 indicates a situation in which the first cable 631 is engaged, and the second cable 632 and the third cable 633 are not engaged. In Case 4, the power management circuit 440 may be connected to the ground via the first resistor R1 and the second resistor R2 in a DC manner. In this case, the processor 420 may identify that the reference voltage Vdc is distributed in a predetermined range by a ratio of the second resistor R2 or based on a ratio of the second resistor R2 between the first resistor R1 and the second resistor R2. In this case, the reference voltage Vdc may mean a voltage supplied to the electronic device 200 from the power management circuit 440. In this case, the measurement value 635 may be within a predetermined range or be as follows.

Measurement Value 635=Reference Voltage $Vdc*\{R2/(R1+R2)\}$ by Case 4

According to the embodiment of the disclosure, Case 5 is a situation in which the second cable 632 and the third cable 633 are engaged, and the first cable 631 is not engaged. In Case 3, the power management circuit 440 may be connected to the ground via the first resistor R1, the third resistor R3, and the fourth resistor R4 in a DC manner. In this case, the processor 420 may identify that the reference voltage Vdc is distributed in a predetermined range by a ratio (R3/R4) of the third resistor R3 and the fourth resistor R4 connected in parallel or based on the ratio (R3/R4) of the third resistor R3 and the fourth resistor R4 connected in parallel between the first resistor R1, the third resistor R3, and the fourth resistor R4. In this case, the reference voltage Vdc may mean a voltage supplied to the electronic device 200 from the power management circuit 440. In this case, the measurement value 635 may be within a predetermined range or be as follows.

Measurement Value 635=Reference Voltage $Vdc*\{$ $(R3/R4)/(R1+(R3/R4))\}$ by Case 5

According to the embodiment of the disclosure, Case 6 indicates a situation in which the second cable 632 is engaged, and the first cable 631 and the third cable 633 are not engaged. In Case 6, the power management circuit 440 may be connected to the ground via the first resistor R1 and the third resistor R3 in a DC manner. In this case, the processor 420 may identify that the reference voltage Vdc is distributed in a predetermined range by a ratio of the third resistor R3 or based on a ratio of the third resistor R3 between the first resistor R1 and the third resistor R3. In this case, the reference voltage Vdc may mean a voltage supplied to the electronic device 200 from the power management circuit 440. In this case, the measurement value 635 may be within a predetermined range or be as follows.

Measurement Value 635=Reference Voltage $Vdc*\{R3/(R1+R3)\}$ by Case 6

According to the embodiment of the disclosure, Case 7 indicates a situation in which the third cable 633 is engaged, and the first cable 631 and the second cable 632 are not engaged. In Case 7, the power management circuit 440 may be connected to the ground via the first resistor R1 and the fourth resistor R4 in a DC manner. In this case, the processor 420 may identify that the reference voltage Vdc is distributed in a predetermined range by a ratio of the fourth resistor R4 or based on a ratio of the fourth resistor R4 between the first resistor R1 and the fourth resistor R4. In this case, the reference voltage Vdc may mean a voltage supplied to the electronic device 200 from the power management circuit 440. In this case, the measurement value 635 may be within a predetermined range or be as follows.

Measurement Value 635=Reference Voltage $Vdc*\{R4/(R1+R4)\}$ by Case 7

In addition, Case 8 may mean a situation in which all the first cable 631, the second cable 632, and the third cable 633 are not engaged. In Case 8, the power management circuit 440 may be opened in a DC manner. In this case, the first resistor R1 may be connected to the power management circuit 440 and the processor 420 in series. In this case, the processor 420 may identify the reference voltage Vdc on the first resistor R1 or a voltage within a predetermined range on the reference voltage Vdc. In this case, the measurement value 635 may be within a predetermined range or be as follows.

Measurement Value 635=Reference Voltage $Vdc$ by Case 8

An electronic device according to various embodiments of the disclosure may include a housing; a first printed circuit board positioned in the housing and including a first antenna, a first connector connected to the first antenna, a second antenna, and a second connector connected to the second antenna; a second printed circuit board disposed in the housing, spaced apart from the first printed circuit board, and including a power management circuit, a third connector electrically connected to the first connector, a fourth connector electrically connected to the second connector, a first detection circuit, and a processor operatively connected to the first detection circuit; a first cable configured to electrically connect the first connector and the third connector; and a second cable configured to electrically connect the second connector and the fourth connector, in which the first detection circuit includes a first resistor positioned between the processor and the power management circuit, and in which the first printed circuit board includes: a second resistor branching off between the first antenna and the first connector and electrically connected to the ground; and a third resistor branching off between the second antenna and the second connector and electrically connected to the ground.

According to the embodiment of the disclosure, the processor may supply a first voltage to the first antenna and the second antenna by using the power management circuit and determine whether the first cable and the second cable are engaged based on voltage values measured by using the first detection circuit.

According to the embodiment of the disclosure, the processor may determine that both the first cable and the second cable are not engaged when identifying that the first voltage or a voltage within a predetermined range from the first voltage is measured by using the first detection circuit.

According to the embodiment of the disclosure, the processor may provide a guide indicating that both the first cable and the second cable are not engaged, and the first cable and the second cable need to be repaired.

According to the embodiment of the disclosure, the processor may determine that the second cable is engaged and the first cable is not engaged when identifying that a second voltage or a voltage within a predetermined range from the second voltage is measured by using the first detection circuit, and the second voltage may mean a voltage value measured on the first resistor when the first voltage is applied to an electrical path between the first resistor and the third resistor.

According to the embodiment of the disclosure, the processor may provide a guide indicating that the first cable is not engaged, and the first cable needs to be repaired.

According to the embodiment of the disclosure, the processor may perform control to forcibly stop the use of a band using the first cable as a transmitting end.

According to the embodiment of the disclosure, the processor may determine that the first cable is engaged and the second cable is not engaged when identifying that a third voltage or a voltage within a predetermined range from the third voltage is measured by using the first detection circuit, and the third voltage may mean a voltage value measured on the first resistor when the first voltage is applied to an electrical path between the first resistor and the second resistor.

According to the embodiment of the disclosure, the processor may provide a guide indicating that the second cable is not engaged, and the second cable needs to be repaired.

According to the embodiment of the disclosure, the processor may perform control to forcibly stop the use of a band using the second cable as a transmitting end.

According to the embodiment of the disclosure, the processor may determine that both the first cable and the second cable are engaged when identifying that a fourth voltage or a voltage within a predetermined range from the fourth voltage is measured by using the first detection circuit, and the fourth voltage may mean a voltage value measured on the first resistor when the first voltage is applied to an electrical path between the first resistor and a resistor in which the second resistor and the third resistor are connected in parallel.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing;
a first printed circuit board positioned in the housing and comprising a first antenna, a first connector connected to the first antenna, a second antenna, and a second connector connected to the second antenna;
memory storing one or more computer programs;
a second printed circuit board disposed in the housing, spaced apart from the first printed circuit board, and comprising a power management circuit, a third connector electrically connected to the first connector, a fourth connector electrically connected to the second connector, a first detection circuit, and one or more processors communicatively coupled to the first detection circuit and the memory;
a first cable configured to electrically connect the first connector and the third connector; and
a second cable configured to electrically connect the second connector and the fourth connector,

24 wherein the first detection circuit comprises a first resistor positioned between the one or more processors and the power management circuit, and
wherein the first printed circuit board comprises:
a second resistor branching off between the first antenna and the first connector and electrically connected to the ground, and
a third resistor branching off between the second antenna and the second connector and electrically connected to the ground.

2. The electronic device of claim 1, wherein the one or more computer programs include computer-executable instructions that, when executed by the one or more processors, cause the electronic device to:
supply a first voltage to the first antenna and the second antenna by using the power management circuit, and
determine whether the first cable and the second cable are engaged based on voltage values measured by using the first detection circuit.

3. The electronic device of claim 2, wherein the one or more computer programs further include computer-executable instructions that, when executed by the one or more processors, cause the electronic device to determine that both the first cable and the second cable are not engaged when identifying that the first voltage or a voltage within a predetermined range from the first voltage is measured by using the first detection circuit.

4. The electronic device of claim 3, wherein the one or more computer programs further include computer-executable instructions that, when executed by the one or more processors, cause the electronic device to provide a guide indicating that both the first cable and the second cable are not engaged, and the first cable and the second cable need to be repaired.

5. The electronic device of claim 2,
wherein the one or more computer programs further include computer-executable instructions that, when executed by the one or more processors, cause the electronic device to determine that the second cable is engaged and the first cable is not engaged when identifying that a second voltage or a voltage within a predetermined range from the second voltage is measured by using the first detection circuit, and
wherein the second voltage means a voltage value measured on the first resistor when the first voltage is applied to an electrical path between the first resistor and the third resistor.

6. The electronic device of claim 5, wherein the one or more computer programs further include computer-executable instructions that, when executed by the one or more processors, cause the electronic device to provide a guide indicating that the first cable is not engaged, and the first cable needs to be repaired.

7. The electronic device of claim 5, wherein the one or more computer programs further include computer-executable instructions that, when executed by the one or more processors, cause the electronic device to perform control to forcibly stop the use of a band using the first cable as a transmitting end.

8. The electronic device of claim 2,
wherein the one or more computer programs further include computer-executable instructions that, when executed by the one or more processors, cause the electronic device to determine that the first cable is engaged and the second cable is not engaged when identifying that a third voltage or a voltage within a predetermined range from the third voltage is measured by using the first detection circuit, and wherein the third voltage means a voltage value measured on the first resistor when the first voltage is applied to an electrical path between the first resistor and the second resistor.

9. The electronic device of claim 8, wherein the one or more computer programs further include computer-executable instructions that, when executed by the one or more processors, cause the electronic device to provide a guide indicating that the second cable is not engaged, and the second cable needs to be repaired.

10. The electronic device of claim 8, wherein the one or more computer programs further include computer-executable instructions that, when executed by the one or more processors, cause the electronic device to perform control to forcibly stop the use of a band using the second cable as a transmitting end.

11. The electronic device of claim 2,
wherein the one or more computer programs further include computer-executable instructions that, when executed by the one or more processors, cause the electronic device to determine that both the first cable and the second cable are engaged when identifying that a fourth voltage or a voltage within a predetermined range from the fourth voltage is measured by using the first detection circuit, and
wherein the fourth voltage means a voltage value measured on the first resistor when the first voltage is applied to an electrical path between the first resistor and a resistor in which the second resistor and the third resistor are connected in parallel.

12. A method of inspecting a cable connection circuit of an electronic device,
wherein the cable connection circuit comprises:
    a first printed circuit board comprising a first antenna, a first connector connected to the first antenna, a second antenna, and a second connector connected to the second antenna;
    a second printed circuit board spaced apart from the first printed circuit board and comprising a power management circuit, a third connector electrically connected to the first connector, a fourth connector electrically connected to the second connector, a first detection circuit, and a processor operatively connected to the first detection circuit;
    a first cable configured to electrically connect the first connector and the third connector; and
    a second cable configured to electrically connect the second connector and the fourth connector,
wherein the first detection circuit comprises a first resistor positioned between the processor and the power management circuit, and
wherein the first printed circuit board comprises:
    a second resistor branching off between the first antenna and the first connector and electrically connected to the ground, and
    a third resistor branching off between the second antenna and the second connector and electrically connected to the ground,
the method comprising:
    supplying a first voltage to the first antenna and the second antenna by using the power management circuit, and
    determining whether the first cable and the second cable are engaged based on voltage values measured by using the first detection circuit.

13. The method of claim 12, wherein the determining of whether the first cable and the second cable are engaged comprises determining that both the first cable and the second cable are not engaged when identifying that the first voltage or a voltage within a predetermined range from the first voltage is measured by using the first detection circuit.

14. The method of claim 13, further comprising:
providing a guide indicating that both the first cable and the second cable are not engaged, and the first cable and the second cable need to be repaired.

15. The method of claim 12,
wherein the determining of whether the first cable and the second cable are engaged further comprises determining that the second cable is engaged and the first cable is not engaged when identifying that a second voltage or a voltage within a predetermined range from the second voltage is measured by using the first detection circuit, and
wherein the second voltage means a voltage value measured on the first resistor when the first voltage is applied to an electrical path between the first resistor and the third resistor.

16. The method of claim 15, further comprising:
providing a guide indicating that the first cable is not engaged, and the first cable needs to be repaired.

17. The method of claim 15, further comprising:
performing control to forcibly stop the use of a band using the first cable as a transmitting end.

18. The method of claim 12,
wherein the determining of whether the first cable and the second cable are engaged further comprises determining that the first cable is engaged and the second cable is not engaged when identifying that a third voltage or a voltage within a predetermined range from the third voltage is measured by using the first detection circuit, and
wherein the third voltage means a voltage value measured on the first resistor when the first voltage is applied to an electrical path between the first resistor and the second resistor.

19. One or more non-transitory computer-readable storage media storing computer-executable instructions that, when executed by one or more processors of an electronic device, cause the electronic device to perform operations of inspecting a cable connection circuit of the electronic device,
wherein the cable connection circuit comprises:
    a first printed circuit board comprising a first antenna, a first connector connected to the first antenna, a second antenna, and a second connector connected to the second antenna;
    a second printed circuit board spaced apart from the first printed circuit board and comprising a power management circuit, a third connector electrically connected to the first connector, a fourth connector electrically connected to the second connector, a first detection circuit, and a processor operatively connected to the first detection circuit;
    a first cable configured to electrically connect the first connector and the third connector; and
    a second cable configured to electrically connect the second connector and the fourth connector,
wherein the first detection circuit comprises a first resistor positioned between the processor and the power management circuit, and wherein the first printed circuit board comprises:

a second resistor branching off between the first antenna and the first connector and electrically connected to the ground, and a third resistor branching off between the second antenna and the second connector and electrically connected to the ground, the operations comprising:

supplying a first voltage to the first antenna and the second antenna by using the power management circuit, and determining whether the first cable and the second cable are engaged based on voltage values measured by using the first detection circuit.

20. The one or more non-transitory computer-readable storage media of claim 19, wherein the determining of whether the first cable and the second cable are engaged comprises determining that both the first cable and the second cable are not engaged when identifying that the first voltage or a voltage within a predetermined range from the first voltage is measured by using the first detection circuit.

\* \* \* \* \*